US007940591B2

(12) United States Patent
Mitchell, Jr.

(10) Patent No.: US 7,940,591 B2
(45) Date of Patent: May 10, 2011

(54) METHODS AND APPARATUSES FOR CONTROLLING FULLY-BUFFERED DUAL INLINE MEMORY MODULES

(76) Inventor: Paul Michael Mitchell, Jr., West Peabody, MA (US)

( * ) Notice: Subject to any disclaimer, the term of this patent is extended or adjusted under 35 U.S.C. 154(b) by 131 days.

(21) Appl. No.: 12/203,824

(22) Filed: Sep. 3, 2008

(65) Prior Publication Data
US 2010/0054067 A1 Mar. 4, 2010

(51) Int. Cl.
*G11C 7/04* (2006.01)
(52) U.S. Cl. .................................................. 365/211
(58) Field of Classification Search ........................ None
See application file for complete search history.

(56) References Cited

U.S. PATENT DOCUMENTS

| | | | |
|---|---|---|---|
| 7,609,523 B1 * | 10/2009 | Ni et al. ........................ | 361/715 |
| 2007/0211548 A1 * | 9/2007 | Jain et al. ...................... | 365/211 |

OTHER PUBLICATIONS

Nasr, Rami Marwan, "FBSIM and the Fully Buffered DIMM Memory System Architecture", Thesis, 128 pages, 2005.

* cited by examiner

*Primary Examiner* — Huan Hoang
*Assistant Examiner* — James G Norman
(74) *Attorney, Agent, or Firm* — Polsinelli Shughart PC

(57) ABSTRACT

Methods and apparatuses are presented for controlling a fully buffered dual inline memory module. In one embodiment, the memory module may include at least two memory chips, a buffer coupled to the at least two memory chips (the buffer serially receiving data to be stored in the at least two memory chips), and a heat sink thermally coupled to the at least two memory chips and thermally coupled to the buffer such that heat generated by the buffer is coupled to a first memory chip within the at least two memory chips. The may be configured such that it operates at a higher temperature than the first memory chip and the refresh rate of the first memory chip may be adjusted when the temperature of the first memory chip is outside of a predetermined range.

17 Claims, 4 Drawing Sheets

METHODS AND APPARATUSES FOR CONTROLLING FULLY-BUFFERED DUAL INLINE MEMORY MODULES

BACKGROUND

Computers are ubiquitous in today's society. They come in all different varieties and can be found in places such as automobiles, the grocery store, banks, personal digital assistants, cell phones, as well as in many businesses. As will be appreciated by almost anyone owning a computer, there is a trend of incorporating more and more functionality into the same amount of space. This trend may be due to many factors, such as, the miniaturization and increasing density of system components with each successive generation of computer. These increases in system density in successive generations of computers may cause the computer to operate at higher temperatures, and therefore, may require greater amounts of power to cool the computer than their predecessors.

One area where the amount of power necessary to cool the computer has increased is with respect to Fully Buffered Dual In-line Memory Modules (FB-DIMMs), which often generate more heat than non-FB-DIMM type memory. The increased heat generated by the FB-DIMM may be dealt with by using various methods that transfer the heat generated by the FB-DIMM away from the FB-DIMM, such as, a heat sink and/or fan coupled to the portions of the FB-DIMM that emanate the greatest amounts of heat. Unfortunately, traditional methods of dealing with heat generated by FB-DIMMs also may result in increasing the operating temperature of other components within the computer system, including portions of the FB-DIMM itself. As the operating temperature of the FB-DIMMs increase, the reliability of one or more of the FB-DIMMs may be hindered. Thus, methods and apparatuses are needed that address one or more of these problems.

SUMMARY

Methods and apparatuses are presented for controlling a fully buffered dual inline memory module. In one embodiment, the memory module may include at least two memory chips, a buffer coupled to the at least two memory chips (the buffer serially receiving data to be stored in the at least two memory chips), and a heat sink thermally coupled to the at least two memory chips and thermally coupled to the buffer such that heat generated by the buffer is coupled to a first memory chip within the at least two memory chips. The buffer may be configured such that it operates at a higher temperature than the first memory chip and the refresh rate of the first memory chip may be adjusted when the temperature of the first memory chip is outside of a predetermined range.

Another embodiment may include the method of operating a memory module in a computer system, the method comprising the acts of monitoring a temperature value of at least one memory chip within a group of memory chips (where the at least one memory chip within the group of memory chips is thermally coupled to a buffer in the memory module), comparing the temperature values of the at least one memory chip with a predetermined range of temperature values, and in the event that the monitored temperature value is outside the predetermined range of temperature values, then reprogramming a refresh rate of the at least one memory chip.

Still other embodiments may include a computer system comprising a central processing unit (CPU), a memory controller coupled to the CPU, and a plurality of memory modules coupled to the memory controller. Each memory module may comprise at least two memory chips, a buffer coupled to the at least two memory chips (the buffer serially receiving data to be stored in the at least two memory chips), and a heat sink thermally coupled to the at least two memory chips and thermally coupled to the buffer such that heat generated by the buffer is coupled to a first memory chip within the at least two memory chips. The buffer may be configured such that it operates at a higher temperature than the first memory chip and the refresh rate of the first memory chip may be adjusted when the temperature of the first memory chip is outside of a predetermined range.

BRIEF DESCRIPTION OF THE DRAWINGS

For a detailed description of the various embodiments of the invention, reference will now be made to the accompanying drawings, in which.

The use of the same reference symbols in different drawings indicates similar or identical items.

DETAILED DESCRIPTION

In some embodiments, methods and apparatuses may be provided that allow the fully-buffered dual inline memory modules (FB-DIMMs) to be more reliable at greater temperatures. FB-DIMMs may be used in all types of computers and may find particular relevance within enterprise computing systems. The methods of operating the FB-DIMMS may include monitoring a temperature measurement associated with one or more memory chips within the FB-DIMM. If this temperature measurement reaches a predetermined reliability threshold or range of values, the FB-DIMM may modify the refresh rate of one or more of those memory chips. By modifying the refresh rate of the FB-DIMMs when the temperature measurement indicates that the FB-DIMM has reached a predetermined reliability threshold, the data integrity of the FB-DIMM may be maintained while having minimal impact on system downtime and/or performance.

Figure 1:
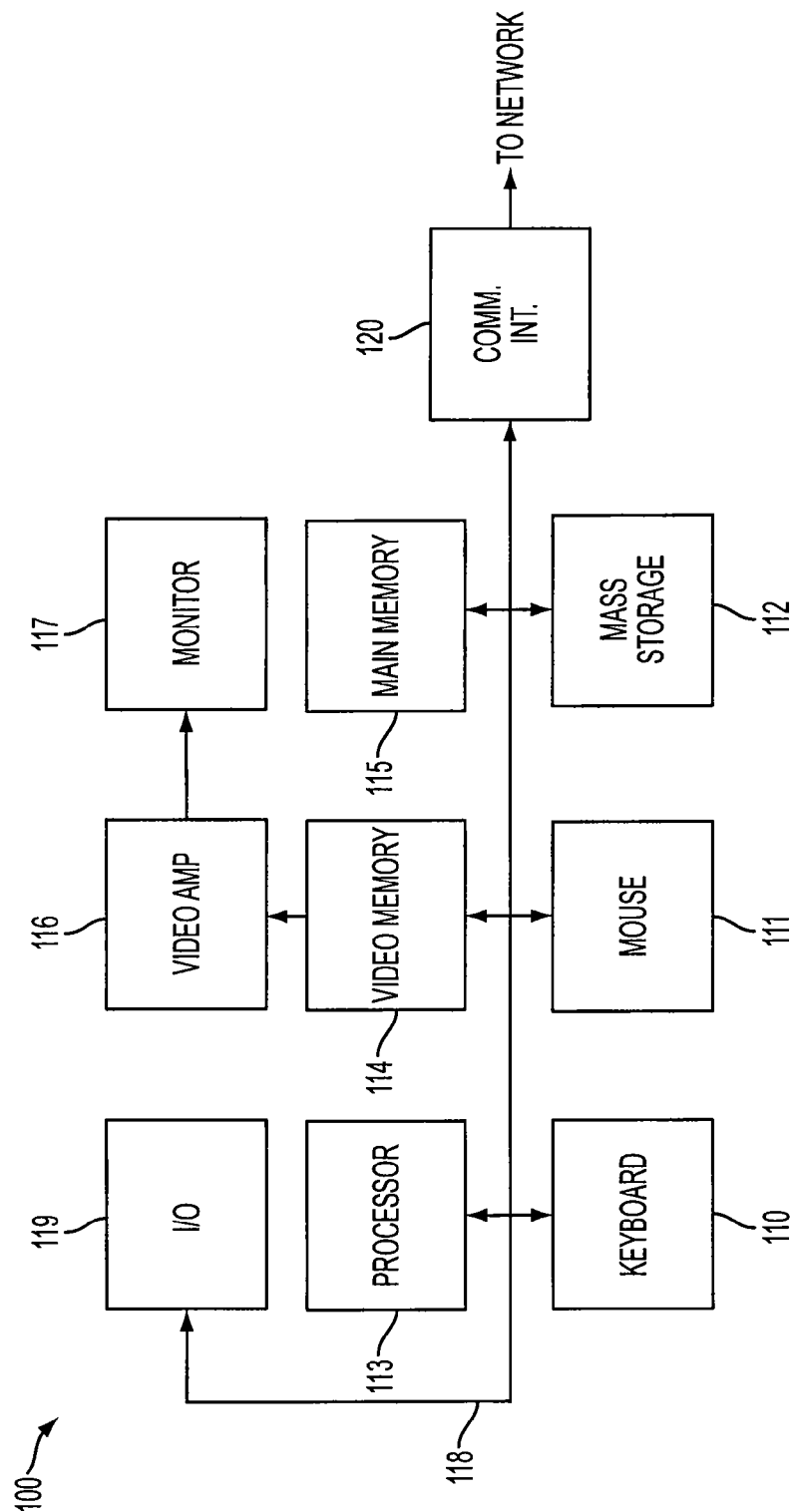
FIG. 1 illustrates an exemplary computer system.

Referring to computer system 100 shown in FIG. 1. In some embodiments, the computer system 100 may be an implementation of enterprise level computers, such as one or more blade-type servers within an enterprise. In other embodiments, the computer system 100 may be a personal computer and/or a handheld electronic device. A keyboard 110 and mouse 111 may be coupled to the computer system 100 via a system bus 118. The keyboard 110 and mouse 111, in one example, may introduce user input to computer system 100 and communicate that user input to a processor 113. Other suitable input devices may be used in addition to, or in place of, mouse 111 and keyboard 110. An input/output unit 119 (I/O) coupled to system bus 118 represents such I/O elements as a printer, audio/video (AV) I/O, etc.

Computer 100 also may include a video memory 114, a main memory 115 and a mass storage 112, all coupled to system bus 118 along with keyboard 110, mouse 111 and processor 113. Mass storage 112 may include both fixed and removable media, such as magnetic, optical or magnetic optical storage systems and any other available mass storage technology. Bus 118 may contain, for example, address lines for addressing video memory 114 or main memory 115. System bus 118 also includes, for example, a data bus for transferring data between and among the components, such as processor 113, main memory 115, video memory 114 and mass storage 112. Video memory 114 may be a dual-ported video random access memory. One port of video memory 114, in one example, is coupled to video amplifier 116, which is used to drive a monitor 117. Monitor 117 may be any type of monitor suitable for displaying graphic images, such as a cathode ray tube monitor (CRT), flat panel, or liquid crystal display (LCD) monitor or any other suitable data presentation device.

In some embodiments, processor 113 is a SPARC® microprocessor from Sun Microsystems, Inc., or a microprocessor manufactured by Motorola, such as the 680XX0 processor, or a microprocessor manufactured by Intel, such as the 80X86, or Pentium® processor. Any other suitable microprocessor or microcomputer may be utilized, however. In some embodiments, the main memory 115 is a FB-DIMM that communicates serially with other system components as described in more detail below with regard to FIG. 2.

Computer 100 also may include a communication interface 120 coupled to bus 118. Communication interface 120 provides a two-way data communication coupling via a network link. For example, communication interface 120 may be a local area network (LAN) card, or a cable modem, and/or wireless interface. In any such implementation, communication interface 120 sends and receives electrical, electromagnetic or optical signals which carry digital data streams representing various types of information.

Code received by computer 100 may be executed by processor 113 as it is received, and/or stored in mass storage 112, or other non-volatile storage for later execution. In this manner, computer 100 may obtain application code in a variety of forms. Application code may be embodied in any form of computer program product such as a medium configured to store or transport computer readable code or data, or in which computer readable code or data may be embedded. Examples of computer program products include CD-ROM discs, ROM cards, floppy disks, magnetic tapes, computer hard drives, servers on a network, and solid state memory devices.

Figure 2:
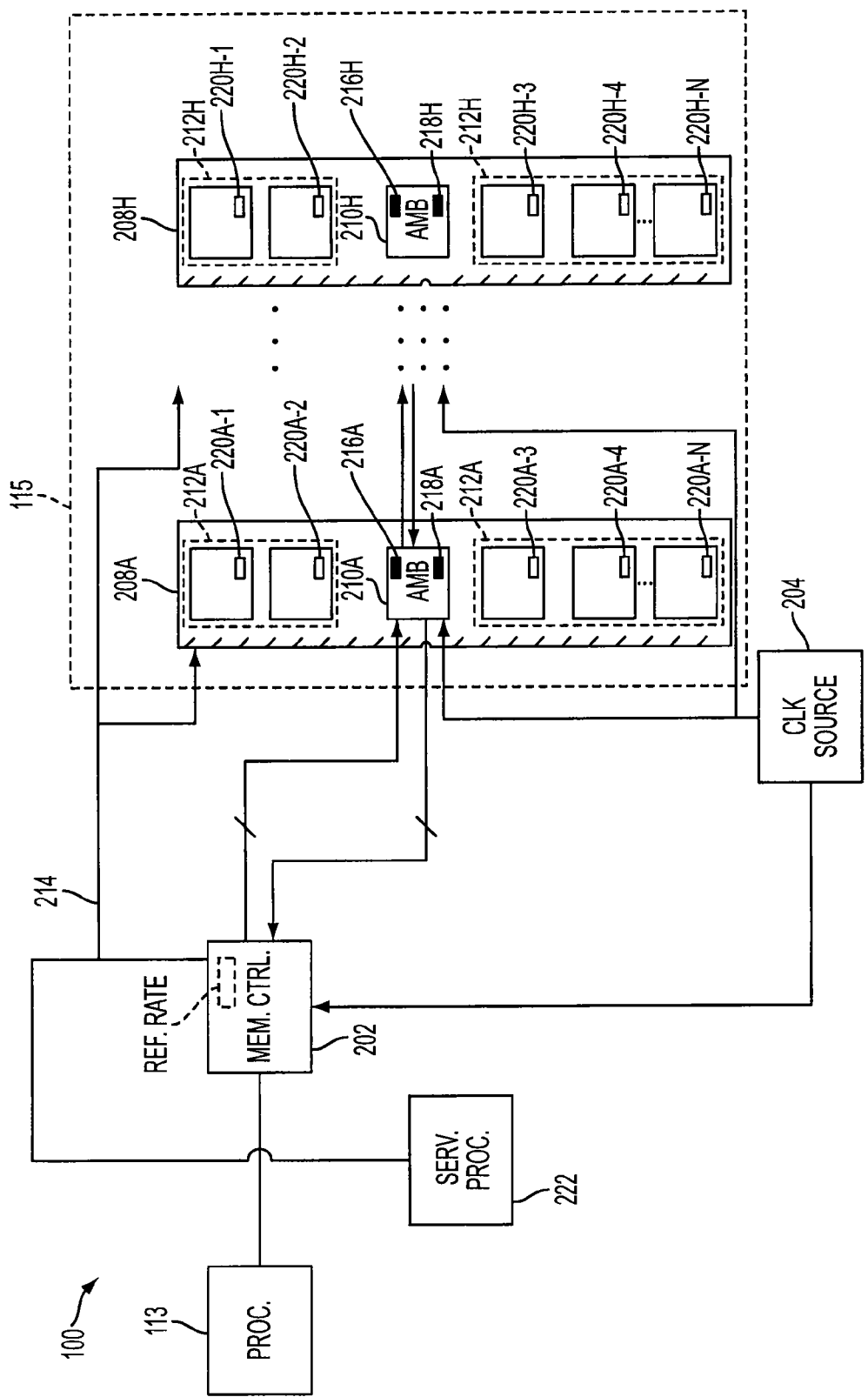
FIG. 2 represents an exemplary memory module configuration.

FIG. 2 depicts the computer system 100 employing an exemplary memory 115 as FB-DIMMs. As shown, the computer system 100 may include a memory controller 202 coupled between the processor 113 and the memory 115. The memory controller 202 may be integrated within the processor 113, or in some embodiments, may exist as a separate component within the computer system 100. During operation, the memory controller 202 may receive signals from the processor that are to be stored in the memory 113. The signals from the processor 113 may be take place as parallel data communication. Since the memory 115 implements FB-DIMMs, the memory controller 202 may communicate data to the memory 115 in serial form, and accordingly the memory controller 202 may be capable of serializing data received from the processor 113.

The computer system 100 also may include a clock source 204 coupled to the memory controller 202 and the memory 115. The clock source 204 may provide a signal to the memory 115 and the memory controller 202 such that they operate in synchronous fashion. In other embodiments, the clock source 204 may provide a timing signal that is asynchronous to the operation of the memory 115 and/or the memory controller 202.

The clock source 204 may take a variety of physical forms, including in some embodiments, a crystal based oscillator with relatively low phase noise and/or clock jitter. In other embodiments, the clock source 204 may be a frequency synthesized signal based on a crystal oscillator signal, such as a phase locked loop (PLL) synthesizer.

As shown in FIG. 2, the memory 115 may include one or more FB-DIMMs 208A-H. While eight FB-DIMMs are illustrated in FIG. 2, it should be appreciated that any number of FB-DIMMs are possible. In fact, one of the advantages of using FB-DIMMs, as opposed to double-data-rate (DDR) memory, is that many more DIMMs are possible with FB-DIMMs thereby allowing storage capacity to be expanded over other technologies, such as DDR. In the embodiments where the computer system 100 is a server, the ability to expand capacity in this manner may be particularly desirable. Furthermore, the latency related to parallel bus loaded memory architectures (such as DDR) may be eliminated by using serial data communication techniques to communicate between the memory controller 202 and the memory 115.

Each FB-DIMM 208A-H may include at least one advanced memory buffer (AMB) 210A-H respectively. The AMB 210A may be serially coupled to the memory controller 202 on the "upstream" side (i.e., the side of the FB-DIMM closest to the memory controller 202) and also may be serially coupled to the AMB 210B of the next FB-DIMM 208B on the "downstream" side (i.e., the side of the FB-DIMM farthest from the memory controller 202). In this manner, each AMB 210A-H may receive serial data from the upstream side of the FB-DIMM and pass this data serially to other FB-DIMMS that are downstream in a daisy-chain fashion. In some embodiments, the FB-DIMMs may communicate with the memory controller using differential serial pairs or lanes that are separate for upstream and downstream communications. For example, in some embodiments, there are 10 downstream lanes and 14 upstream lanes.

Memory reads and writes may occur independent of each other because the upstream and downstream lanes are separate. Upstream communications from the FB-DIMMs 208A-H to the memory controller 202, such a memory read, may occur separate from downstream communications from the memory controller 202 to the FB-DIMMs 208A-H, such as a memory write.

Each FB-DIMM 208A-H also may include separate groups of memory chips 212A-H. The groups of memory chips 212A-H may be memory chips of the type used in non-FB-DIMM type systems, such as DDR or DDR2. Since these groups of memory chips 212A-H may be of the type used in non-FB-DIMM type systems, they may receive their data in parallel fashion. The AMB 210A-H therefore may be responsible for taking serial data communications from the memory controller 202, buffering this data, and passing it along to the memory chips 212A-H in a parallel fashion.

As shown in FIG. 2, the clock source 204 may be routed to each FB-DIMM 208A-H separately such that each FB-DIMM receives its own clock line. In the embodiments where the clock source 204 includes a PLL, the clock source may de-skew various clocks delivered to each of the FB-DIMMs 208A-H. Exemplary frequencies for the clock source 204 include 133 MHz (e.g., DDR2-533), 166 MHz (e.g., DDR2-667), and 200 MHz (e.g., DDR2-800).

The memory controller 202 also may couple to the FB-DIMMs 208A-H via a relatively low frequency bus 214. Exemplary low frequency busses include the SMBus and/or the I2C bus operating in the kilohertz frequency range. Each AMB 210A-H may include at least one configuration register 216. The memory controller 202 (or other components within the computer system 100), may store configuration details in the configuration register 216 using the bus 214. In some embodiments, the desired refresh rate for each of the FB-DIMMs 208A-H may be stored in the register 216. Exemplary refresh rates include 7.8 μS at cooler temperatures and 3.9 μS at hotter temperatures. Furthermore, some embodiments may include the ability to configure each of the FB-DIMMs with a unique refresh rate by storing different values in the register 216.

Communication via the upstream and downstream lanes may take place much faster than the operating frequency of the memory chips 212. For example, in some embodiments, communication is twelve times the operating frequency of the memory chips 212. In other embodiments, where the memory chips 212 comprise DDR2 memory, communication via the upstream and downstream lanes may take place at six times the operating frequency of the memory chips 212. Because upstream and downstream communications are conducted between the memory controller 202 and the AMBs 210A-H, the AMBs 210A-H may operate at higher operational frequencies.

In general, as the operating frequency of an integrated circuit increases the power consumed and the heat generated by the integrated circuit increases. Thus, the AMBs 210A-H operating at these higher frequencies may consume more power and operate at higher temperatures than the memory chips 212. For example, in some embodiments, the power density of the AMBs 210A-H may be 18.5 W/cm2 while the power density of the memory chips 212 may be approximately 0.3 W/cm2.

Figure 3:
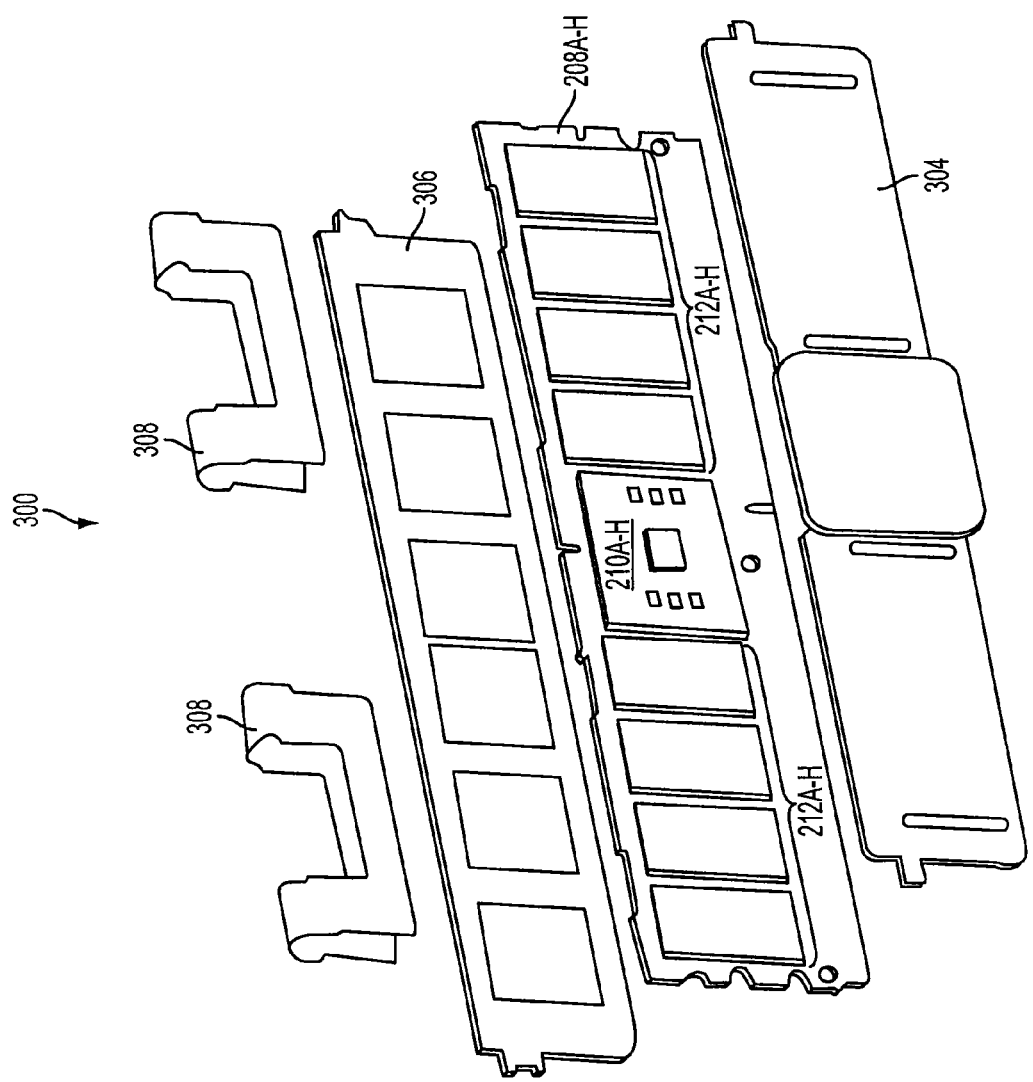
FIG. 3 depicts an exemplary heat spreader arrangement.

FIG. 3 illustrates an exemplary FB-DIMM heat spreader arrangement 300 situated about the exemplary FB-DIMMs 208A-H. As shown, the heat spreader arrangement 300 may include a front heat spreader 304 that sandwiches thermal interface material 306 to the FB-DIMM 302 using clips 308. During operation, heat from the higher temperature portions of the FB-DIMM, i.e., the AMBs 210A-H, may be dissipated along the front heat spreader 304 to lower temperature portions of the FB-DIMM, i.e., the memory chips 212A-H. As a result of this temperature gradient, the operating temperature of memory chips 212A-H may be increased, which may affect the operation of the memory chips 212A-H. In some embodiments, the memory chips 212A-H may be implemented with a storage element whose storage capability varies inversely with temperature. For example, the memory elements 212A-H may be implemented using dynamic random access memory (DRAM) integrated circuit technology, where storage elements include a capacitor whose storage abilities vary inversely with temperature. That is, as the temperature increases, the DRAM capacitor's ability to retain its stored value may decrease. Thus, as the AMBs 210A-H operate, they may cause the memory chips 212A-H to increase in temperature, and as a result, the ability of the memory chips 212A-H to retain their values may diminish.

Referring again to FIG. 2, the computer system 100 may interactively adjust the refresh rates of the memory chips 212A-H as their ability to retain data degrades with temperature. In this manner, the storage state of the memory storage element (e.g., charge in a storage capacitor) may be topped off in the event that this storage state degrades because of temperature increases.

The AMBs 210A-H may include one or more temperature sensors 218A-H. In some embodiments, the one or more temperature sensors 218A-H may be integrated within each AMB 210A-H during manufacturing in the form of silicon based diodes (not shown), which may have temperature coefficient of approximately negative two millivolts per degree Celsius. Thus, as the temperature increases, the voltage across these diodes may decrease. Similarly, as the temperature decreases, the voltage across these diodes may increase. In other embodiments, the one or more temperature sensors 218A-H may be integrated within each AMB 210A-H during manufacturing in the form of the difference between the voltage across two or more silicon based diodes, which may have a positive temperature coefficient instead of a negative one.

In some embodiments, each memory chip within the memory chips 212A-H may include temperature sensors akin to the type employed as temperature sensors 218A-H. For example, each memory chip within the group of memory chips 212A may include sensors 220A-1 through 220A-n (for n number of memory chips) where each sensor is integrated during manufacture.

Referring still to FIG. 2, the computer system 100 may further include a service processor 222 coupled to the FB-DIMMs 208A-H. In some embodiments, the service processor 222 may be coupled to the FB-DIMMs 208A-H via the low frequency bus 214. In other embodiments, the service processor may couple to the FB-DIMMs 208A-H via the upstream and/or downstream connections.

Figure 4:
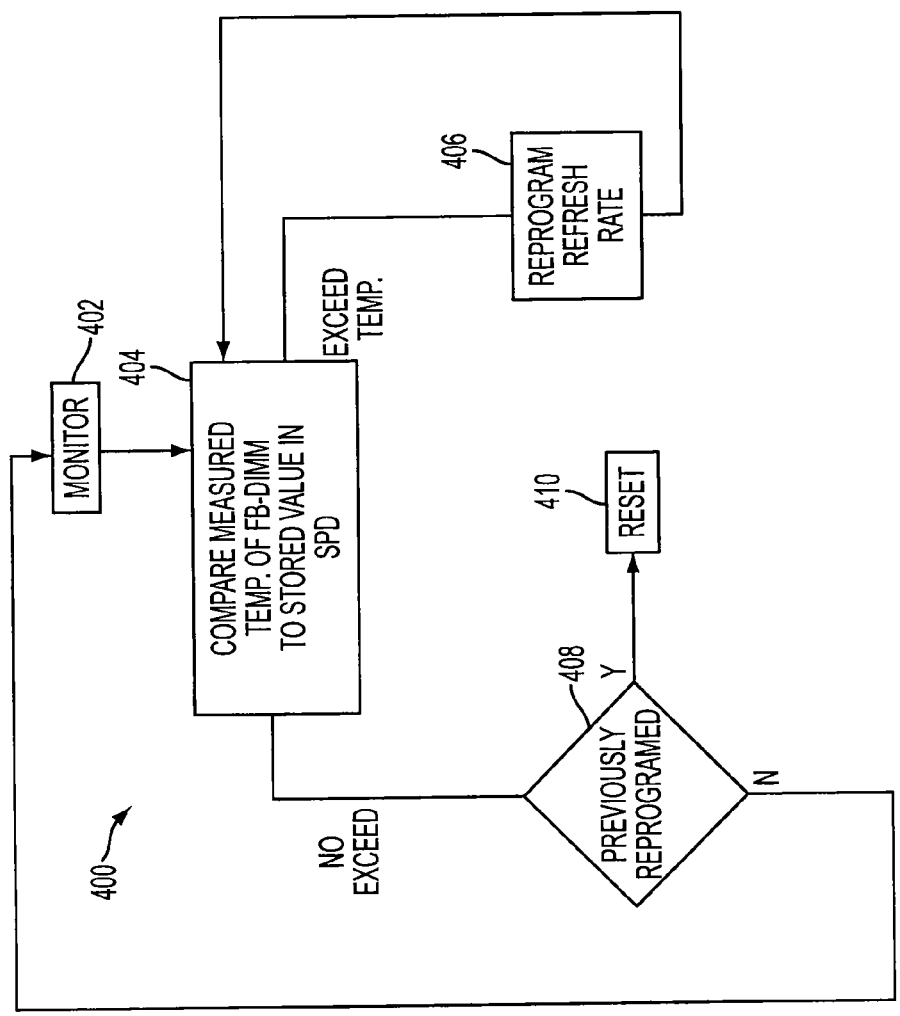
FIG. 4 shows a flowchart illustrating exemplary operation of a memory module.

FIG. 4 illustrates an exemplary flowchart 400 that may be employed to interactively adjust the refresh rates of one or more of the individual memory chips within the groups of the memory chips 212A-H. Referring to the flowchart 400 in conjunction with the computer system 100 shown in FIG. 2, in block 402, the temperatures of each of sensors 218A-H and/or sensors 220A-1 through 220A-n may be monitored by the service processor 222. In block 404, the value monitored in block 402 may be compared to a predetermined value stored in the service processor 222. For example, the predetermined temperature value may be 850 Celsius in some embodiments. When the temperature of one or more chips within the memory chips 208A-H exceeds this predetermined value, then the refresh rate of one or more of the memory chips 212A-H may be reprogrammed accordingly by the memory controller 202 per block 406. In some embodiments, the reprogramming of block 406 may occur over the low frequency bus 214.

The reprogrammed refresh rate may be either increased or decreased to correspond to the temperature trend of the storage element within the memory chips in some embodiments. In these embodiments, the comparison of block 404 may compare to ranges of predetermined temperatures such that reprogramming per block 406 may occur when outside this temperature range and control may flow to block 408 (described in detail below) otherwise.

By reprogramming the refresh rate per block 406, the overall data integrity of the computer system 100 over temperature may be improved. Without reprogramming the refresh rate in this manner, the computer system 100 may need to be shut down or reset because the memory chips are operating out of temperature range and causing data integrity problems. Shutting down or resetting the system may undesirably impact the overall uptime of the computer system 100.

Referring again to block 404, in the event that the comparison reveals that the temperature of the memory chips does not exceed a predetermined value, or is not outside a predetermined temperature range, then control flows to block 408. In block 408, the service processor 222 may determine whether the memory chip in question has been previously reprogrammed. If the memory chip has not been previously programmed, then control flows back to block 402 where monitoring may occur for additional memory chips.

If, on the other hand, the memory chip has been previously programmed and the comparison from block 406 reveals that it does not currently exceed the predetermined temperature (or outside of the predetermined temperature range), then refresh rate may be reset in block 410. Since increased refresh rates may cause the memory chips to consume additional power and consume more of the available bandwidth, by resetting the refresh rate of the memory chips that are no longer exceeding the predetermined temperature (or outside of the predetermined temperature range), the amount of power consumed by the memory chips and the bandwidth consumed by the memory chips may be minimized. In some embodiments, hysteresis may be employed between the reprogramming that may occur in block 406 and the reset that may occur in block 410 to prevent the refresh rate from being thrashed back and forth.

As was mentioned previously, the FB-DIMMs 208A-H may offer serial point-to-point communication using the AMBs 210A-H. In some embodiments, when the AMB 210A receives data it may determine if that data is intended for the FB-DIMM 208A, and if not then pass the data along to the next FB-DIMM 208B, where its AMB 210B determines if the data is intended for the FB-DIMM 208B. Depending on the intended location of the data, this process may continue along each of the FB-DIMMs 208A-H until the intended location of the data is determined. As this process moves from the FB-DIMM 208A to the FB-DIMM 208H, a greater number of potential intended memory locations may be identified. Accordingly, in some embodiments, the probability of determining the intended memory location may increase as successive AMBs determine that data does not belong to them—i.e., data is likely to be satisfied in earlier AMBs rather than later AMBs.

Because data is likely to be satisfied in earlier AMBs rather than later AMBs, the execution load and/or traffic of successive AMBs may be different. For example, AMBs closer to the memory controller 202 may have higher execution loads because they communicate more traffic than AMBs further down the serial point-to-point chain, and therefore, the amount of heat that successive AMBs generate may be different. In some embodiments, the service processor 222 may account for this trend by adjusting the refresh rates of each of the AMBs 210A-H independently and/or more frequently for AMBs closer to the memory controller 202. In some embodiments, the service processor 222 may account for this trend by implementing separate hysteresis levels for each of the AMBs 210A-H.

The above discussion is meant to be illustrative of the principles and various embodiments of the present invention. Numerous variations and modifications will become apparent once the above disclosure is fully appreciated. For example, instead of implementing the memory chips 212A-H with storage elements that vary inversely with temperature, the memory chips 212A-H may be implemented with a storage element whose storage capability varies directly with temperature. That is, as the temperature increases, the storage element's ability to retain its stored value may increase. In these embodiments, as the AMBs 210A-H operate, they may cause the memory chips 212A-H to increase in temperature, and as a result, the ability of the memory chips 212A-H to retain their values may increase. The claims should be interpreted to include any and all such variations and modifications. In addition, the above description has broad application, and the discussion of any embodiment is meant only to be exemplary, and is not intended to intimate that the scope of the disclosure, including the claims, is limited to these embodiments.

I claim:

1. A memory module, comprising:
  at least two memory chips;
  a buffer coupled to the at least two memory chips, the buffer serially receiving data to be stored in the at least two memory chips; and
  a heat sink thermally coupled to the at least two memory chips and thermally coupled to the buffer such that heat generated by the buffer is coupled to a first memory chip within the at least two memory chips;
  wherein the buffer operates at a higher temperature than the first memory chip; and
  wherein a refresh rate of the first memory chip is adjusted when the temperature of the first memory chip is outside of a predetermined range, the refresh rate of the first memory chip is adjusted independent of another refresh rate of a second memory chip within the at least two memory chips.

2. The memory module of claim 1, wherein the at least two memory chips further comprise a plurality of memory storage elements whose data retention abilities decrease as the buffer operating temperature increases and the memory module is configured to receive refresh rate adjustments from an external memory controller.

3. The memory module of claim 1, wherein the data received by the buffer is distributed to the at least two memory chips in parallel.

4. The memory module of claim 1, wherein hysteresis is implemented for the adjustment of the refresh rates, and the level of hysteresis used to adjust the refresh rate of the first memory chip is different than the level of hysteresis used to adjust the other refresh rate of the second memory chip.

5. The memory module of claim 1, wherein the first memory chip is located closer to the buffer than the second memory chip, and the refresh rate of the first memory chip is greater than the other refresh rate of the second memory chip.

6. The memory module of claim 1, wherein each of the at least two memory chips further comprises a temperature sensor.

7. The memory module of claim 6, wherein the temperature sensor is integrated within each of the at least two memory chips during manufacture.

8. A method of operating a memory module in a computer system, the method comprising the acts of:
  monitoring a temperature value of at least one memory chip within a group of memory chips, wherein the at least one memory chip within the group of memory chips is thermally coupled to a buffer in the memory module;
  comparing the temperature values of the at least one memory chip with a predetermined range of temperature values; and
  in the event that the monitored temperature value is outside the predetermined range of temperature values, then reprogramming a refresh rate of the at least one memory chip, where reprogramming the refresh rate of the at least one memory chip occurs independently for each memory chip within the group of memory chips.

9. The method of claim 8, wherein the at least one memory chip within the group of memory chips operates at a higher temperature than the buffer.

10. The method of claim 9, wherein the at least one memory chip is located closer to the buffer than at least one other memory chip within the group of memory chips and the refresh rate of the at least one memory chip is higher than the at least one other memory chip.

11. The method of claim 8, wherein the act of reprogramming occurs without regard to powering down the computer system.

12. The method of claim 8, wherein the refresh rate is reduced in the event that the monitored temperature value is within the predetermined range of temperature values and the refresh rate was previously reprogrammed.

13. The method of claim 12, wherein the act of reprogramming further includes implementing hysteresis prior to changing the refresh rate.

14. The method of claim 13, wherein the at least one memory chip is located closer to the buffer than at least one other memory chip within the group of memory chips and the hysteresis level of the at least one memory chip is different than the hysteresis of the at least one other memory chip.

15. A computer system comprising:
- a central processing unit (CPU);
- a memory controller coupled to the CPU; and
- a plurality of memory modules coupled to the memory controller, each memory module comprising:
- at least two memory chips;
- a buffer coupled to the at least two memory chips, the buffer serially receiving data to be stored in the at least two memory chips; and
- a heat sink thermally coupled to the at least two memory chips and thermally coupled to the buffer such that heat generated by the buffer is coupled to a first memory chip within the at least two memory chips;
- wherein the buffer operates at a higher temperature than the first memory chip; and
- wherein a refresh rate of the first memory chip is adjusted when the temperature of the first memory chip is outside of a predetermined range, the refresh rate of the first memory chip is adjusted independent of another refresh rate of a second memory chip within the at least two memory chips.

16. The computer system of claim 15, wherein the plurality of memory modules comprise first and second memory modules, the first memory module comprising a first buffer that is electrically coupled to a second buffer in the second memory module.

17. The computer system of claim 16, wherein the first buffer operates at a higher temperature than the second buffer and the refresh rate of the at least two memory chips in the first memory module is higher than the other refresh rate of the at least two memory chips in the second memory module.

\* \* \* \* \*